United States Patent
Wagner et al.

(10) Patent No.: US 11,888,097 B2
(45) Date of Patent: Jan. 30, 2024

(54) OPTOELECTRONIC COMPONENT WITH A MAGNETIC STRUCTURE AND METHOD FOR PRODUCING SAME

(71) Applicant: OSRAM OLED GmbH, Regensburg (DE)

(72) Inventors: Konrad Wagner, Regensburg (DE);
Daniel Richter, Bad Abbach (DE);
Gunnar Petersen, Regensburg (DE);
Nicole Berner, Walderbach (DE);
Michael Förster, Altenthann (DE)

(73) Assignee: OSRAM OLED GmbH, Regensburg (DE)

( * ) Notice: Subject to any disclaimer, the term of this patent is extended or adjusted under 35 U.S.C. 154(b) by 529 days.

(21) Appl. No.: 17/253,566

(22) PCT Filed: Jul. 1, 2019

(86) PCT No.: PCT/EP2019/067599
§ 371 (c)(1),
(2) Date: Dec. 17, 2020

(87) PCT Pub. No.: WO2020/011584
PCT Pub. Date: Jan. 16, 2020

(65) Prior Publication Data
US 2021/0273144 A1    Sep. 2, 2021

(30) Foreign Application Priority Data

Jul. 11, 2018 (DE) .......................... 102018116812.8

(51) Int. Cl.
*H01L 33/54* (2010.01)
*H01L 25/075* (2006.01)
*H01L 33/56* (2010.01)

(52) U.S. Cl.
CPC .......... *H01L 33/54* (2013.01); *H01L 25/0753* (2013.01); *H01L 33/56* (2013.01); *H01L 2933/005* (2013.01)

(58) Field of Classification Search
CPC ..... H01L 25/0753; H01L 33/54; H01L 33/56; H01L 2933/005; H01L 21/67709; H01L 31/143; H01L 31/162
(Continued)

(56) References Cited

U.S. PATENT DOCUMENTS

2012/0012868 A1   1/2012   Chang et al.
2013/0119419 A1   5/2013   Vadhavkar et al.
(Continued)

FOREIGN PATENT DOCUMENTS

DE   102014116953 A1   5/2016

OTHER PUBLICATIONS

Wikipedia, https://en.wikipedia.org/wiki/Radio-frequency_identification, Retrieved Jul. 11, 2018 (18 pages).
(Continued)

*Primary Examiner* — Hoai V Pham
(74) *Attorney, Agent, or Firm* — ARENTFOX SCHIFF LLP

(57) ABSTRACT

An optoelectronic component (1) is specified, with at least one radiation-emitting semiconductor chip generating electromagnetic radiation during operation, a coating surrounding the at least one semiconductor chip in lateral directions, a magnetic structure covered by the coating, wherein the magnetic structure enables the component to be identified. Furthermore, a process for the manufacture of such an optoelectronic component is given.

18 Claims, 3 Drawing Sheets

Figure 1:
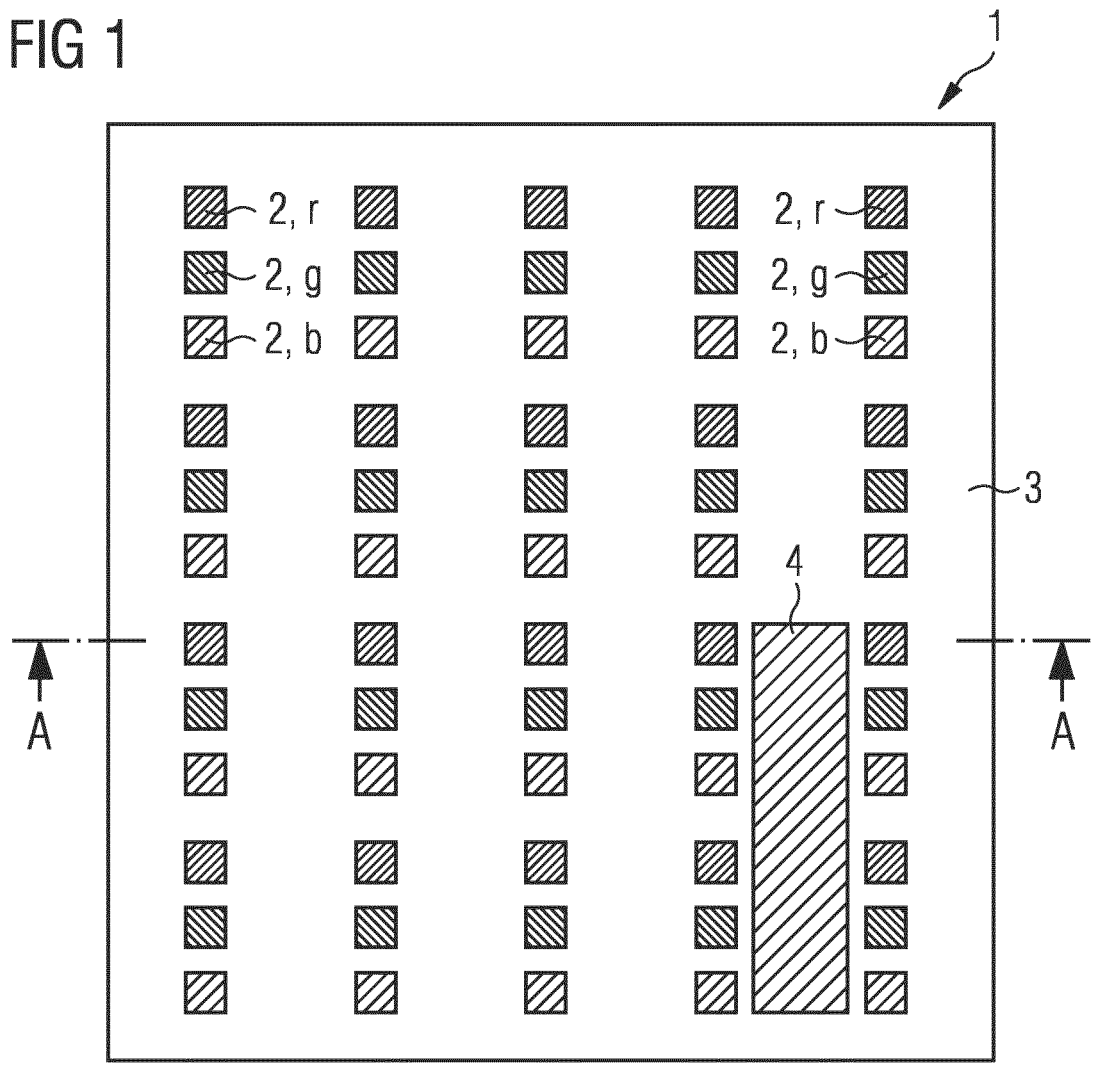

(58) Field of Classification Search
USPC .................................................. 257/21, 40
See application file for complete search history.

(56) References Cited

U.S. PATENT DOCUMENTS

2017/0018688 A1   1/2017   Mazed et al.
2017/0328963 A1   11/2017  Schmitt et al.

OTHER PUBLICATIONS

International Search Report for International Patent Application No. PCT/EP2019/067599, dated Oct. 1, 2019 (5 pages).

OPTOELECTRONIC COMPONENT WITH A MAGNETIC STRUCTURE AND METHOD FOR PRODUCING SAME

This application is a 35 U.S.C. § 371 National Phase of PCT Application No. PCT/EP2019/067599, filed Jul. 1, 2019, which claims priority to German Patent Application No. 102018116812.8, filed Jul. 11, 2018, the disclosures of each of which are hereby incorporated by reference herein in their entireties.

An optoelectronic component is specified. A method for producing such an optoelectronic component is also specified.

One object to be solved is to specify an optoelectronic component that is particularly easy to identify and inexpensive. A further object to be solved is to specify a method for producing such an optoelectronic component.

The optoelectronic component is, for example, a radiation-emitting component emitting electromagnetic radiation, in particular visible light, during operation. For example, the component is a light-emitting diode. Alternatively or additionally, the component can be a radiation-receiving component.

The optoelectronic component has a main plane of extension. The lateral directions are aligned parallel to the main plane of extension and the vertical direction is perpendicular to the main plane of extension.

Furthermore, a plurality of optoelectronic components can form a display device configure to display images or video sequences. This is to say that a plurality of the optoelectronic components forms a display device, for example.

According to at least one embodiment, the optoelectronic component comprises at least one radiation-emitting semiconductor chip generating electromagnetic radiation during operation. The at least one radiation-emitting semiconductor chip is, for example, a light-emitting diode chip, in short LED chip or a laser diode chip. The at least one radiation-emitting semiconductor chip is configured, for example, to emit light of one colour. Alternatively or additionally, the optoelectronic component can include at least one radiation-receiving semiconductor chip. The component can then include a photodiode chip, for example.

The at least one semiconductor chip preferably has a top surface that is opposite a bottom surface. The top surface and the bottom surface are connected to one another by a side surface.

It is also possible that the optoelectronic component has a plurality of optoelectronic semiconductor chips. In this case, the semiconductor chips of the plurality of semiconductor chips are spaced apart from one another in lateral directions. This is to say that directly adjacent semiconductor chips have a distance in lateral directions and do not touch one another. Furthermore, the bottom surfaces and top surfaces of the plurality of semiconductor chips are in a common plane.

If the optoelectronic component has the plurality of semiconductor chips, the semiconductor chips can be arranged in a matrix-like manner, i.e., arranged along rows and columns in a plane. Furthermore, the semiconductor chips can be arranged, for example, at grid points of a regular grid.

The plurality of semiconductor chips is configured to emit and/or to receive light of different colours.

The optoelectronic component can, for example, have at least one pixel comprising, for example, three radiation-emitting semiconductor chips. The radiation-emitting semiconductor chips are then configured in pairs, for example, to generate light of different colours during operation. For example, one radiation-emitting semiconductor chip emits light of red colour, another radiation-emitting semiconductor chip emits light of green colour and another radiation-emitting semiconductor chip emits light of blue colour. Furthermore, the optoelectronic component can comprise a plurality of pixels.

Furthermore, the optoelectronic component can comprise a carrier, for example. The at least one radiation-emitting semiconductor chip or the plurality of radiation-emitting semiconductor chips is/are arranged on the carrier. Furthermore, the carrier can have contact areas which, for example, can completely penetrate the carrier or are arranged on an outer surface of the carrier. The carrier can comprise or consist of a plastic material, for example, an epoxy or a silicone, or a ceramic material. The contact areas comprise or consist of a metal, for example. For example, the metal is silver or copper.

According to at least one embodiment, the optoelectronic component comprises a coating surrounding the at least one semiconductor chip in the lateral direction. For example, the coating does not overlap with the at least one radiation-emitting semiconductor chip in plan view. A radiation-transmitting surface formed by the top surface of the at least one semiconductor chip can thus be free of the coating. Furthermore, it is possible that the coating does not overlap with the at least one radiation-emitting semiconductor chip in a side view formed by a cross-section in vertical direction through the optoelectronic component.

Furthermore, a passivation layer can be arranged on the radiation-transmitting surface of the at least one semiconductor chip. The passivation layer is preferably transparent to the electromagnetic radiation generated by the at least one radiation-emitting semiconductor chip.

If, for example, the optoelectronic component has the plurality of radiation-emitting semiconductor chips, the coating is arranged between directly adjacent radiation-emitting semiconductor chips. Furthermore, the coating is formed connected, in particular multiple connected.

According to at least one embodiment, the optoelectronic component comprises a magnetic structure covered by the coating. The coating completely covers the magnetic structure. This is to say that in plan view the coating completely overlaps with the magnetic structure. Furthermore, the coating protrudes over the magnetic structure preferably in lateral directions such that a side surface of the magnetic structure is covered by the coating. For example, the magnetic structure is in direct and immediate contact with the coating.

If, for example, the optoelectronic component has a plurality of radiation-emitting semiconductor chips, the magnetic structure can be located between adjacent radiation-emitting semiconductor chips. Preferably the magnetic structure is arranged between adjacent pixels.

The magnetic structure, for example, has a plurality of sections, each of which can have different magnetic properties. The sections of the plurality of sections can each be distinguished by different magnetic flux densities. The flux density describes the surface density of the magnetic flux to which a strength of a magnetic field corresponds that passes vertically through a certain surface element. The flux density is defined here, for example, by an area element which is arranged at a distance above the magnetic structure. Furthermore, the surface element is spanned in lateral directions and overlaps with one of the sections of the plurality of sections. Furthermore, the magnetic flux can be directed so that the sections of the plurality of sections can each have one polarity. This means, for example, that the magnetic structure has sections that can each have a different polarisation.

According to at least one embodiment, the magnetic structure enables the component to be identified. For example, by means of the different polarisation of the sections of the plurality of sections, corresponding information can be encoded as bits, for example. For example, one polarisation can represent a logical zero, while another polarisation represents a logical one. Information consisting of numbers and letters can be coded using these bits. With the help of these numbers and letters, the optoelectronic component can be uniquely identified.

In at least one embodiment, the optoelectronic component comprises at least one radiation-emitting semiconductor chip generating electromagnetic radiation during operation, a coating surrounding the at least one semiconductor chip in the lateral direction, a magnetic structure covered by the coating, the magnetic structure enabling the component to be identified.

One idea of the optoelectronic component described here is, inter alia, to integrate a magnetic structure into an optoelectronic component so that this component can be uniquely identified. The magnetic structure has an advantageous high data density per area and can therefore be integrated into the optoelectronic component in a particularly space-saving manner. Furthermore, the magnetic structure is comparatively inexpensive.

The magnetic structure can be applied to a top side of the optoelectronic component, i.e., a side on which the radiation-transmitting surface is also located, so that the component can be identified with advantage even when mounted. The magnetic structure is covered by a coating that protects the magnetic structure from external influences.

According to at least one embodiment, the magnetic structure is machine-readable. This is to say that the information for identification of the component can be read out by means of a reading device, for example. The reading device is preferably configured to detect the polarisation of the sections of the plurality of sections of the magnetic structure and to decode the different polarisations into the corresponding bits. By means of the reading device, the optoelectronic component can thus be uniquely identified. An observer, on the other hand, cannot optically detect the magnetic structure.

According to at least one embodiment, the coating is configured to create a homogeneous colour impression for an observer. For example, the coating is impermeable to electromagnetic radiation in the visible range, such as light surrounding the optoelectronic component and/or electromagnetic radiation generated during operation of the at least one radiation-emitting semiconductor chip. The coating can, for example, be absorptive or diffusely reflective of emitted radiation.

For example, the coating is formed from a matrix material comprising a plastic such as a silicone, an epoxy or an epoxy hybrid material. A colouring agent such as carbon black or a colour pigment can be added to the plastic. Thus, the coating can appear black or white or coloured.

According to at least one embodiment, the coating covers the magnetic structure so that the magnetic structure is not optically visible to an observer. For example, the density of the colour pigments can be pre-set so that the magnetic structure is completely hidden by the coating. This has the advantage that the visual impression of the surface is not disturbed for an observer.

According to at least one embodiment, the at least one radiation-emitting semiconductor chip is surrounded by an cover body, on which the coating is arranged. In this case, the cover body preferably covers a side surface of the at least one radiation-emitting semiconductor chip completely. For example, the cover body terminates flush with the radiation-transmitting surface of the at least one radiation-emitting semiconductor chip. The cover body is preferably in direct and immediate contact with the side surface of the at least one radiation-emitting semiconductor chip.

In a region of the optoelectronic component in which no magnetic structure is arranged in plan view, the coating is in direct and immediate contact with the cover body. In another region where the magnetic structure is located, the magnetic structure is located between the coating and the cover body. In this case, the magnetic structure is in direct contact with the cover body and the coating. In plan view, the coating preferably overlaps the cover body completely.

The cover body preferably comprises a matrix material. The matrix material can be a plastic, such as a silicone, an epoxy or an epoxy hybrid material. Light-reflecting particles can also be incorporated into the matrix material. For example, the particles are formed with or contain at least one of the following materials: $TiO_2$, $BaSO_4$, $ZnO$, $Al_xO_y$.

Electromagnetic radiation emitted at the side surface of the at least one radiation-emitting semiconductor chip can be reflected by the cover body. The reflected electromagnetic radiation is preferably reflected in the direction of the radiation-transmitting surface. Advantageously, the light extraction of the optoelectronic component is increased.

According to at least one embodiment, the cover body has a plurality of recesses filled with a magnetic material. The plurality of recesses preferably penetrates the cover body in the vertical direction. The plurality of recesses can have a round, oval or squared shape in plan view. The plurality of recesses can, for example, completely penetrate the body of the cover body. It is also possible that the plurality of recesses only partially penetrates the cover body. A bottom surface of the plurality of recesses is then formed by the cover body. The magnetic material is preferably completely filled into the plurality of recesses. For example, the magnetic material has a rod shape for each recess. The magnetic material preferably does not protrude beyond the plurality of recesses and preferably terminates flush with a top surface of the cover body opposite the bottom surface.

The recesses of the plurality of recesses are each spaced apart in lateral directions. This is to say that directly adjacent recesses do not touch one another. Preferably the recesses of the plurality of recesses are arranged in matrix-like manner, i.e. in columns and rows. This is to say that the recesses can, for example, be arranged at grid points of a regular grid.

According to at least one embodiment, the plurality of recesses filled with the magnetic material forms the magnetic structure. With the vertical arrangement of the plurality of recesses, a comparatively high integration density can be achieved. This is to say that the magnetic structure enables a particularly high data density per area and can thus be integrated into the optoelectronic component in a particularly space-saving manner. Furthermore, the rod shape can result in an increased field strength per rod and thus the signal strength and stability of the magnetic structure can be increased.

According to at least one embodiment, a magnetic material is formed in lateral directions in the form of a plurality of strips. The strips of the plurality of strips each have a thickness, a width and a length. The width and the length are bigger than the thickness of the strips. Furthermore, the length is greater than the width. The plurality of strips is arranged directly on cover body. The plurality of strips is thus in direct and immediate contact with the cover body. The coating, which is arranged above the plurality of strips, covers the plurality of strips completely and is in direct and immediate contact with the plurality of strips. Furthermore, the strips are preferably spaced apart from one another in lateral directions. The plurality of strips preferably extends along a further strip.

According to at least one embodiment, the plurality of strips forms the magnetic structure.

According to at least one embodiment, a magnetic material is introduced into the coating. For example, the magnetic material is introduced into the matrix material of the coating in the form of magnetic particles. Furthermore, this matrix material with the magnetic particles can be arranged on the cover body in the form of the plurality of strips. For example, the matrix material of the coating that has the magnetic particles can be completely surrounded by the matrix material of the coating that does not have the magnetic particles.

According to at least one embodiment, the magnetic structure is arranged between the coating and the cover body. If the magnetic structure is formed as the plurality of strips or by the plurality of recesses filled with a magnetic material, the magnetic structure is commonly completely encapsulated by the cover body and the coating. Furthermore, a large part of the magnetic material introduced into the coating can be completely encapsulated by the coating individually.

According to at least one embodiment, the magnetic material comprises or is formed from a magnetic metal. One of the following materials is suitable for the metal, for example: Fe, Ni, Co, Cr.

According to at least one embodiment, the magnetic material comprises or is formed from $Fe_2O_3$ or $CrO_2$. Furthermore, other magnetic materials that have the desired magnetic properties are also conceivable.

Furthermore, a method for producing an optoelectronic component is specified. Preferably, the method is suitable for the production of an optoelectronic component described here. This is to say that an optoelectronic component described here can be produced using the method described or is produced using the method described. All features disclosed in connection with the optoelectronic component are therefore also disclosed in connection with the method and vice versa. According to at least one embodiment, the method comprises the step of providing at least one radiation-emitting semiconductor chip generating electromagnetic radiation during operation.

According to at least one embodiment, the method comprises the step of generating a magnetic structure which is laterally spaced from the at least one radiation-emitting semiconductor chip.

According to at least one embodiment, the method comprises the step of applying a coating surrounding the at least one radiation-emitting semiconductor chip in lateral direction and covering the magnetic structure. The coating can be applied, for example, by means of a photolithographic process or a mask, so that a radiation-transmitting surface of the at least one radiation-emitting semiconductor chip is free from the coating.

For example, the material of the coating is present in a flowable form during application. In this case, the material of the coating is cured after application to form the coating. Furthermore, the material of the coating can be applied by spraying, screen printing or squeegee, for example.

According to at least one embodiment, the magnetic structure enables the component to be identified.

According to at least one embodiment, the at least one radiation-emitting semiconductor chip is embedded in a cover body before the step of generating the magnetic structure. "Embedding" can mean that the at least one radiation-emitting semiconductor chip is in direct contact with the cover body and the cover body completely covers a side surface of the at least one radiation-emitting semiconductor chip.

The material of the cover body is present during application, for example in a flowable form. In this case the material of the cover body is cured after the application to the cover body. Furthermore, the material of the cover body can be applied by spraying, screen printing or squeegee, for example.

According to at least one embodiment, a plurality of recesses are generated in the cover body. The plurality of recesses is produced by material removal in areas of the regions of recesses of the cover body.

According to at least one embodiment, the plurality of recesses is filled with a magnetic material which forms the magnetic structure. The material of the magnetic material is present during application, for example, in a flowable form. In this case, the material of the magnetic material is cured to form the magnetic material after filling.

According to at least one embodiment, the plurality of recesses is created by means of a laser process. The shape of the plurality of recesses can be preferably round in a cross-section in lateral directions. Furthermore, oval or angular cross-sections are possible.

According to at least one embodiment, a magnetic material is deposited in a structured manner on the cover body by means of a lithography and electroplating process. Furthermore, the lithography process can be the generation of the plurality of recesses in the cover body. For example, a starting layer of the magnetic material can be deposited in the plurality of recesses and the magnetic material can be produced by means of the electroplating process.

According to at least one embodiment, the coating has magnetic particles. The magnetic material is then formed by the magnetic particles introduced into the coating. The magnetic particles can, for example, be introduced into a matrix material of the coating. The matrix material mixed with the particles can be applied to the cover body in the form of a plurality of strips.

The matrix material encapsulates the majority of the magnetic particles advantageously completely. Only a small part of the magnetic particles can not be completely encapsulated on a surface facing away from the optoelectronic component. It is therefore advantageous that the magnetic particles are particularly well protected against external influences such as corrosion.

In a subsequent step, the matrix material of the coating, which has no magnetic particles, can be applied over or between the plurality of strips, so that the matrix material without particles completely surrounds the matrix material with particles.

In the following, the optoelectronic components described here as well as the method described here are explained in more detail using exemplary embodiments and the corresponding figures.

Figure 2:
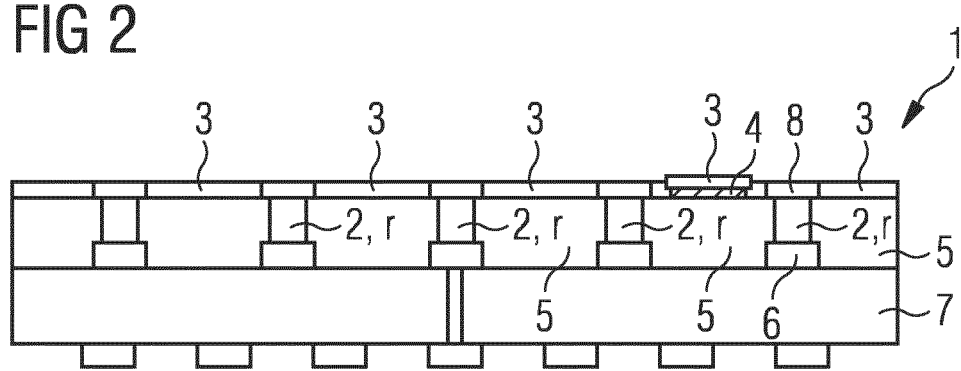
Figure 3:
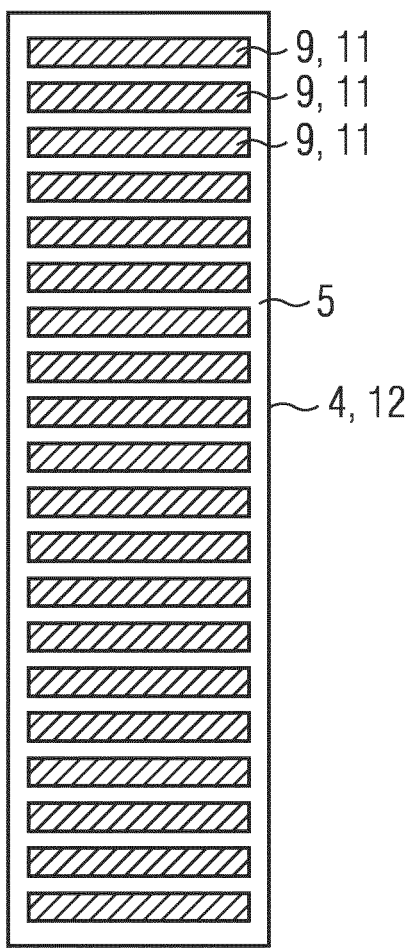
Figure 4:
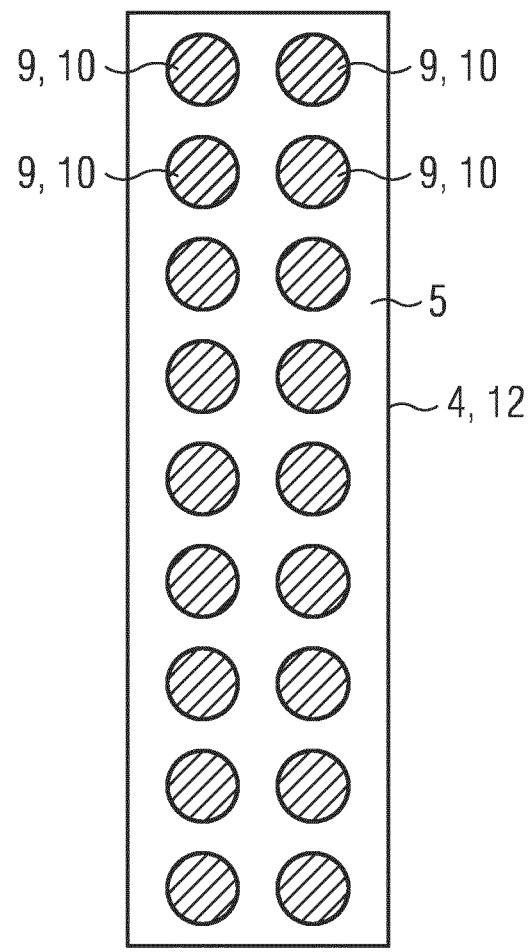
Figure 5:
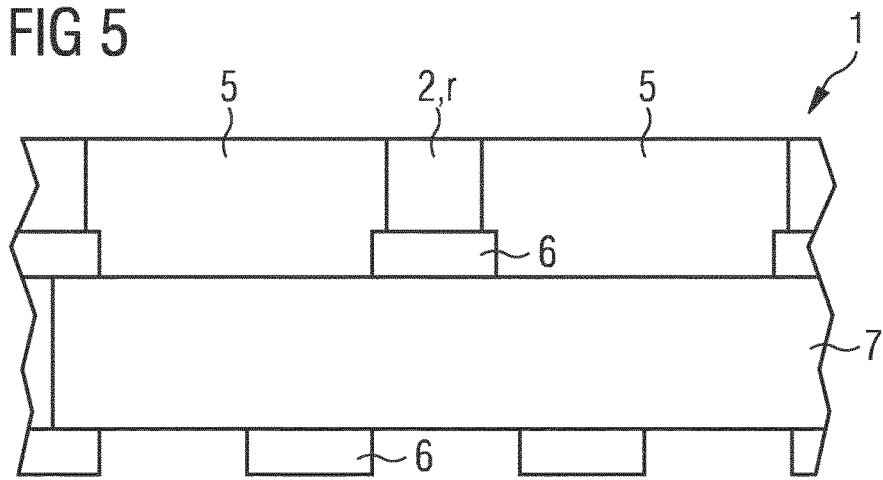
Figure 6:
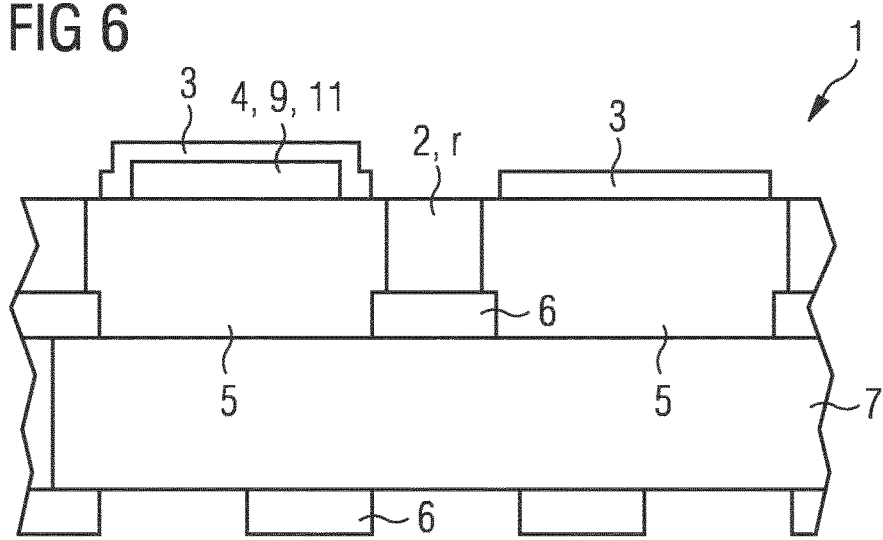

They show:

FIG. 1 schematic sectional view of an exemplary embodiment of an optoelectronic component described here, FIG. 2 schematic sectional view of an exemplary embodiment of an optoelectronic component described here, FIGS. 3 and 4 are schematic sectional views of an exemplary embodiment of a magnetic structure described here, FIGS. 5 and 6 schematic sectional views of method steps of an exemplary embodiment of a method described here for producing an optoelectronic component.

Figure 7:
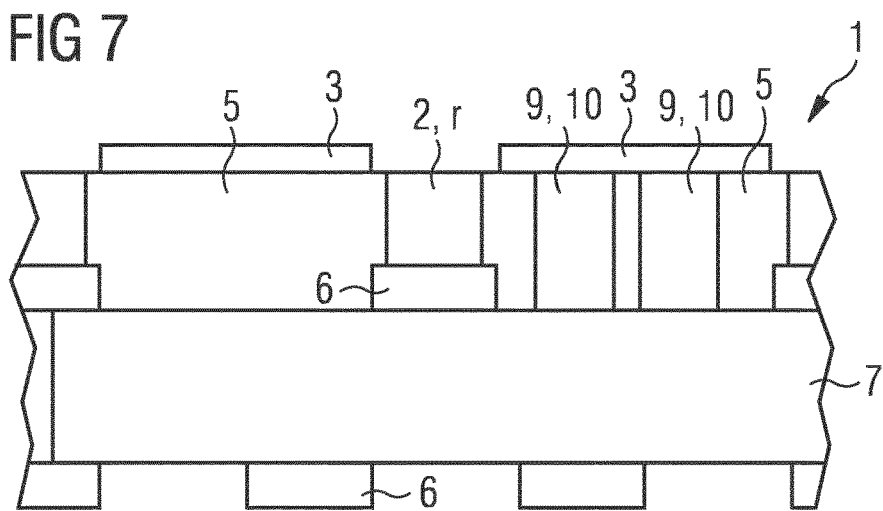

FIG. 7 schematic sectional view of an exemplary embodiment of an optoelectronic component described here.

Identical, similar or similarly acting elements are marked with the same reference signs in the figures. The figures and the proportions of the elements shown in the figures to one another are not to be regarded as true to scale. Rather, individual elements can be oversized for better representability and/or comprehensibility.

The schematic sectional view of FIG. 1 shows an exemplary embodiment of an optoelectronic semiconductor chip described here.

According to FIG. 1, the optoelectronic component 1 has a plurality of radiation-emitting semiconductor chips 2, r, g, b, which are arranged at a distance from one another in lateral directions. The radiation-emitting semiconductor chips 2, r, g, b are configured to emit light of red colour r, a light of green colour g and a light of blue colour b. Three radiation-emitting semiconductor chips 2, r, g, b are combined to form one pixel. The three radiation-emitting semiconductor chips 2, r, g, b are in pairs configured to generate light of different colours during operation.

Furthermore, the optoelectronic component 1 comprises a coating 3, which surrounds the plurality of radiation-emitting semiconductor chips 2, r, g, b in a lateral direction. The coating 3 does not overlap with the plurality of radiation-emitting semiconductor chips 2, r, g, b in plan view. This is to say that one radiation-transmitting surface of the plurality of radiation-emitting semiconductor chips 2, r, g, b is free of the coating 3.

Further, the optoelectronic component 1 has a magnetic structure 4, which is covered by the coating 3. The coating 3 completely covers the magnetic structure 4. The magnetic structure 4 is located between the plurality of radiation-emitting semiconductor chips 2, r, g, b. Here, the magnetic structure 4 is arranged between adjacent pixels.

The schematic sectional view of FIG. 2 shows the exemplary embodiment of an optoelectronic semiconductor chip 1 described here along the section line AA shown in FIG. 1.

According to FIG. 2, the optoelectronic component 1 has a carrier 7 on which contact areas 6 are arranged. The contact areas 6 completely penetrate the carrier 3 in certain regions. The plurality of radiation-emitting semiconductor chips 2, r, g, b is arranged on the carrier 7 or the contact areas 6 and can be supplied with current via these.

The plurality of radiation-emitting semiconductor chips 2, r, g, b are surrounded by an cover body 5 on which the coating 3 is arranged. The cover body 5 completely covers a side surface of the plurality of radiation-emitting semiconductor chips 2, r, g, b and terminates flush with the radiation-transmitting surface. Furthermore, the cover body 5 is in direct contact with the carrier 7 and the contact areas 6 arranged on it.

In a region of the optoelectronic component 1, in which no magnetic structure 4 is arranged in plan view, the coating 3 is in direct and immediate contact with the cover body 5. In another region, in which the magnetic structure 4 is arranged, the magnetic structure 4 is arranged between the coating 3 and the cover body 5.

Furthermore, the coating 3 protrudes over the magnetic structure 4 in lateral directions and a side surface of the magnetic structure 4 is completely covered by the coating 3. The magnetic structure 4 is completely encapsulated by the coating 3 and the cover body 5.

Furthermore, a passivation layer 8 is arranged on the radiation-transmitting surface of the plurality of radiation-emitting semiconductor chips 2, r, g, b.

The schematic sectional views of the FIGS. 3 and 4 each show an exemplary embodiment of a magnetic structure 4 described here.

According to FIG. 3 a magnetic material 9 is formed in lateral directions in the form of a plurality of strips 11. The plurality of strips 11 is arranged directly on the cover body 5. In addition, the strips 11 are spaced apart in lateral directions. The plurality of strips 11 extends along a further strip 12. The plurality of strips 11 forms the magnetic structure 4.

Furthermore, the magnetic material 9 can be introduced into the coating 3 in the form of magnetic particles. The magnetic particles are then incorporated in a matrix material of the coating 3. The matrix material mixed with the particles is arranged in the form of the plurality of strips 11 on the cover body 5. The matrix material of the coating 3, which does not contain magnetic particles, can completely surround the plurality of strips 11.

In contrast to the exemplary embodiment of the magnetic structure 4 according to FIG. 3, the exemplary embodiment shown in FIG. 4 shows the cover body 5, in which a plurality of recesses 10 are incorporated. The plurality of recesses 10 are each filled with the magnetic material 9. The recesses 10 of the plurality of recesses each have a round shape in plan view. The magnetic material 9 has a rod shape for each recess.

The recesses 10 are arranged at a distance from one another in lateral directions. The recesses 10 are arranged in a matrix, i.e. in columns and rows. The plurality of recesses extends along a further strip 12. The plurality of recesses 10 with the magnetic material 9 forms the magnetic structure 4.

The schematic sectional views of FIGS. 5 and 6 show method steps of an exemplary embodiment of a method described here for producing an optoelectronic component.

According to FIG. 5, the plurality of radiation-emitting semiconductor chips 2, r, g, b is provided generating electromagnetic radiation during operation. The plurality of radiation-emitting semiconductor chips 2, r, g, b are arranged on a provided carrier 7, each of the plurality of radiation-emitting semiconductor chips 2, r, g, b being arranged on a contact area 6.

The plurality of radiation-emitting semiconductor chips 2, r, g, b is embedded in the cover body 5. This is to say that the plurality of radiation-emitting semiconductor chips 2, r, g, b are in direct contact with the cover body and the cover body 5 completely covers the side surfaces of the semiconductor chips of the plurality of radiation-emitting semiconductor chips 2, r, g, b.

In a further step, according to FIG. 6, the magnetic structure 4 is applied in lateral directions spaced apart from the plurality of radiation-emitting semiconductor chips 2, r, g, b. Subsequently, the coating 3 is applied over the cover body 5 and the magnetic structure 4. The magnetic structure 4 is completely encapsulated by the cover body 5 and the applied coating.

The schematic sectional view of FIG. 7 shows an exemplary embodiment of an optoelectronic semiconductor chip described here.

As shown in FIG. 7, the cover body 5 has a plurality of recesses 10 which only partially penetrate the cover body 5. A bottom surface of the plurality of recesses 10 is formed by the cover body 5. The magnetic material 9 is completely filled into the plurality of recesses 10. The magnetic material 9 does not protrude beyond the plurality of recesses and terminates flush with a top surface of the cover body opposite the bottom surface.

The present application claims the priority of the German application DE 102018116812.8, the disclosure content of which is hereby incorporated by reference.

The invention is not limited to the description based on the exemplary embodiments. Rather, the invention comprises any new feature as well as any combination of features, which includes in particular any combination of features in the claims, even if this feature or combination itself is not explicitly stated in the claims or exemplary embodiments.

REFERENCES 1 optoelectronic component
2 radiation-emitting semiconductor chip
3 coating
4 magnetic structure
5 cover body
6 Contact area
7 carrier
8 passivation
9 magnetic material
10 recesses
11 strips
12 more strips
r red
g green
b blue

The invention claimed is:

1. Optoelectronic component, comprising:
at least one radiation-emitting semiconductor chip generating electromagnetic radiation during operation,
a coating surrounding the at least one radiation-emitting semiconductor chip in lateral directions, and
a magnetic structure covered by the coating, wherein
the magnetic structure enables the optoelectronic component to be identified,
the magnetic structure has a plurality of sections with different polarizations, and
the different polarizations encode an identification information of the optoelectronic component.

2. Optoelectronic component according to claim 1, in which the magnetic structure is machine-readable.

3. Optoelectronic component according to claim 1, in which the coating is configured to produce a homogeneous colour impression for an observer.

4. Optoelectronic component according to claim 1, in which the coating covers the magnetic structure so that the magnetic structure is not optically visible for an observer.

5. Optoelectronic component according to claim 1, in which the at least one radiation-emitting semiconductor chip is surrounded by a cover body, on which the coating is arranged.

6. Optoelectronic component according to claim 1, further comprising:
a cover body having a plurality of recesses filled with a magnetic material, and
the plurality of recesses with the magnetic material forms the magnetic structure.

7. Optoelectronic component according to claim 6, in which the magnetic material comprises or is formed from a magnetic metal.

8. Optoelectronic component according to claim 6, in which the magnetic material comprises or is formed from $Fe_2O_3$ or $CrO_2$.

9. Optoelectronic component according to claim 1, further comprising:
a magnetic material formed in lateral directions in a form of a plurality of strips, and
the plurality of strips forms the magnetic structure.

10. Optoelectronic component according to claim 9, in which the magnetic material is introduced into the coating.

11. Optoelectronic component according to the preceding claim 10, in which the magnetic structure is arranged between the coating and a cover body.

12. Method for producing an optoelectronic component comprising:
providing of at least one radiation-emitting semiconductor chip generating electromagnetic radiation during operation,
generating a magnetic structure spaced apart in lateral directions from the at least one radiation-emitting semiconductor chip, and
applying a coating surrounding the at least one radiation-emitting semiconductor chip in lateral directions and covering the magnetic structure, wherein
the magnetic structure enables the optoelectronic component to be identified,
the magnetic structure has a plurality of sections with different polarizations, and
the different polarizations encode an identification information of the optoelectronic component.

13. Method according to claim 12, wherein, prior to generation of the magnetic structure, the at least one radiation-emitting semiconductor chip is embedded in a cover body.

14. Method according to claim 13, wherein
a plurality of recesses is generated in the cover body, and
the plurality of recesses is filled with a magnetic material and the plurality of filled recesses forms the magnetic structure.

15. Method according to claim 14, wherein the plurality of recesses is generated by a laser process.

16. Method according to claim 13, wherein a magnetic material is deposited in a structured manner on the cover body by a lithography and electroplating process.

17. Method according to claim 12, wherein the coating comprises magnetic particles.

18. Optoelectronic component, comprising:
at least one radiation-emitting semiconductor chip generating electromagnetic radiation during operation,
a coating surrounding the at least one radiation-emitting semiconductor chip in lateral directions, and
a magnetic structure covered by the coating, wherein:
the at least one radiation-emitting semiconductor chip is surrounded by a cover body, on which the coating is arranged,
the cover body has a plurality of recesses filled with a magnetic material,
the plurality of recesses with the magnetic material forms the magnetic structure, and
the magnetic structure enables the optoelectronic component to be identified.

* * * * *